United States Patent [19]

Jindal et al.

[11] Patent Number: 5,858,181
[45] Date of Patent: Jan. 12, 1999

[54] PHYSICAL VAPOR DEPOSITION OF TITANIUM NITRIDE ON A NONCONDUCTIVE SUBSTRATE

[75] Inventors: Prem C. Jindal; Dennis T. Quinto, both of Greenburg, Pa.

[73] Assignee: Kennametal Inc., Latrobe, Pa.

[21] Appl. No.: 112,013

[22] Filed: Aug. 25, 1993

Related U.S. Application Data

[62] Division of Ser. No. 866,079, Apr. 1, 1992, Pat. No. 5,264, 297, which is a continuation of Ser. No. 490,856, Mar. 9, 1990, abandoned.

[51] Int. Cl.$^6$ .................................................. C23C 14/34
[52] U.S. Cl. ...................... 204/192.15; 427/523; 427/530
[58] Field of Search .................................. 427/523, 527, 427/530; 204/298.05, 192.12, 192.15

[56] References Cited

U.S. PATENT DOCUMENTS

| | | |
|---|---|---|
| 3,329,601 | 7/1967 | Mattox . |
| 3,900,592 | 8/1975 | Kennedy et al. . |
| 3,988,955 | 11/1976 | Engel et al. . |
| 4,127,416 | 11/1978 | Lumby et al. . |
| 4,169,913 | 10/1979 | Kobayashi et al. . |
| 4,226,082 | 10/1980 | Nishida ............................. 427/530 X |
| 4,252,862 | 2/1981 | Nishida ................................. 428/472 |
| 4,337,300 | 6/1982 | Itaba et al. ......................... 427/249 X |
| 4,399,168 | 8/1983 | Kallander et al. ...................... 428/701 |
| 4,401,719 | 8/1983 | Kobayashi . |
| 4,402,994 | 9/1983 | Kobayashi et al. ................. 427/530 X |
| 4,406,669 | 9/1983 | Sarin et al. . |
| 4,411,960 | 10/1983 | Mizuhara ............................... 428/472 |
| 4,461,799 | 7/1984 | Gavrilov et al. . |

(List continued on next page.)

FOREIGN PATENT DOCUMENTS

| | | |
|---|---|---|
| 0191554 | 1/1988 | European Pat. Off. . |
| 0252046 | 1/1988 | European Pat. Off. . |
| 224839 | 6/1985 | Germany . |
| 0064380 | 11/1983 | Japan . |
| 60-141647 | 7/1985 | Japan . |
| 60-212847 | 10/1985 | Japan . |
| 60-221565 | 11/1985 | Japan . |
| 60-224778 | 11/1985 | Japan . |
| 63-297223 | 12/1988 | Japan . |
| 2157282 | 10/1985 | United Kingdom . |
| 2192196 | 5/1987 | United Kingdom . |

OTHER PUBLICATIONS

B. North, "Ceramic Cutting Tools—A Review," Int. J. High Technology Ceramics (1987) pp. 113–127.

Metals Handbook Ninth Ed., American Society for Metals (1980) pp. 448 to 465, 372–379, 858.

"Designing with Kennametal," Kennametal Inc. (1967), inside front cover: pp. 1–3).

"Properties and Proven Uses of Kennametal Hard Carbide Alloys," (1977) pp. 14 and 15.

Guy, "Elements of Physical Metallurgy," Addison–Wesley Pub. Co. (1959), p. 256.

Rao et al., "Electrical and Thermal Conductivity of Sialon Ceramics," Ceramic Bulletin, vol. 57, No. 6 (1978) pp. 591–595.

Jindal et al., "Adhesion Measurements of Chemically Vapor Deposited and Physically Vapor Deposited Hard Coatings on WC–Co Substrates," Thin Solid Films, 154 (1987) pp. 361–375.

(List continued on next page.)

*Primary Examiner*—Nam Nguyen
*Attorney, Agent, or Firm*—John J. Prizzi

[57] ABSTRACT

A process for physical vapor deposition of a refractory coating such as titanium nitride on a nonconductive substrate such as a ceramic substrate and the coated substrate produced thereby. The nonconductive substrate is coated by cleaning the nonconductive substrate surfaces and then depositing a first layer of a refractory metal such as titanium metal on the nonconductive substrate by physical vapor deposition. A second layer of a refractory compound such as titanium nitride is then deposited on the first layer by physical vapor deposition to produce a coated nonconductive substrate having enhanced coating adhesion.

6 Claims, 1 Drawing Sheet

U.S. PATENT DOCUMENTS

| | | | |
|---|---|---|---|
| 4,469,489 | 9/1984 | Sarin et al. | 427/249 X |
| 4,507,189 | 3/1985 | Doi et al. | 427/530 X |
| 4,532,149 | 7/1985 | McHargue | 427/527 |
| 4,539,251 | 9/1985 | Sugisawa et al. . | |
| 4,547,470 | 10/1985 | Tanase et al. . | |
| 4,563,433 | 1/1986 | Yeckley et al. . | |
| 4,578,087 | 3/1986 | Tanaka et al. . | |
| 4,619,748 | 10/1986 | Moll et al. . | |
| 4,634,600 | 1/1987 | Shimizu et al. | 427/527 |
| 4,693,944 | 9/1987 | Sugisawa et al. . | |
| 4,801,510 | 1/1989 | Mehrotra et al. | 428/698 |
| 4,810,530 | 3/1989 | D'Angelo et al. | 427/215 |
| 4,818,635 | 4/1989 | Ekstrom et al. | 428/698 |
| 4,852,999 | 8/1989 | Mehrotra et al. . | |
| 4,902,395 | 2/1990 | Yoshimura | 427/530 |
| 4,959,331 | 9/1990 | Mehrotra et al. . | |
| 4,959,332 | 9/1990 | Mehrotra et al. . | |
| 4,960,735 | 10/1990 | Mehrotra et al. . | |
| 4,965,231 | 10/1990 | Mehrotra et al. . | |
| 4,973,388 | 11/1990 | Francois et al. | 427/527 X |

OTHER PUBLICATIONS

Thorp et al., "Electrical Conductivity in Hot–Pressed Nitrogen Ceramics," Journal of Materials Science 11 (1976) pp. 1494–1500.

"Mechanical and Electrical Properties of AlSiMag Ceramics," Chart No. 691, American Lava Corporation.

Coad, J. P., Warrington, P., Newberry, R. B. & Jacobs, M. H., "Titanium Nitride Coatings by Sputter Ion Plating," Materials and Design, vol. VI, No. 4, pp. 190–195.

Encyclopedia of Chemical Technology, vol. 20, p. 42 (3rd Edition).

McGraw–Hill, Dictionary of Scientific and Technical Terms, Fourth Edition, p. 322 (1989).

PHYSICAL VAPOR DEPOSITION OF TITANIUM NITRIDE ON A NONCONDUCTIVE SUBSTRATE

This is a divisional of application Ser. No. 07/866,079 filed Apr. 1, 1992, now U.S. Pat. No. 5,264,299 which was a continuation of application Ser. No. 07/490,856, filed on Mar. 9, 1990, abandoned.

FIELD OF THE INVENTION

This invention relates to a process for physical vapor deposition of a refractory coating on a nonconductive substrate and the product produced thereby. More particularly, this invention relates to a process for physical vapor deposition of a titanium nitride coating on a ceramic substrate and the product produced thereby.

DESCRIPTION OF THE RELATED ART

Various methods of physically depositing a vaporized material on a substrate, such as a base metal, are well known. For example, a gaseous specie may be physically deposited on a metal substrate by evaporation, reactive evaporation, ion-plating, and sputtering.

A typical ion-plating system for coating a substrate is described in U.S. Pat. No. 3,329,601. The system includes a vacuum chamber containing a metal source, an electron source such as a filament and a substrate material supported within a substrate holder biased negatively with respect to a plasma to be generated within the chamber. In operation, the chamber is evacuated and then filled with an inert gaseous specie, such as argon. Electrons are then emitted by the filament and the metal source. Some of the electrons collide with neutral molecules in the plasma causing excitement and partial ionization of the gaseous species. This state of partially ionized and excited gaseous species along with free electrons is generally referred to as the plasma. The excited particles, upon returning to lower energy states, also emit photons and a visible glow is observed surrounding the substrate. Under the influence of an applied electric field, argon ions from the "glow" region are accelerated and collide with the biased substrate, effectively cleaning the substrate surface of contaminants and raising the surface temperature of the substrate. Independent heating of the substrate may also be possible prior to ion bombardment. Once the cleaning is completed, a coating metallic source, such as titanium, contained within a crucible is heated by known means causing evaporation of the coating material into the glow discharge. The ionized metal is allowed to react with a gaseous specie such as ionized nitrogen during the ion-plating process. The ion-plating process results in a uniform coating of a material such as titanium nitride, on the substrate.

Titanium and/or titanium nitride coatings have been successfully applied by physical vapor deposition to cemented carbides and tool steel substrates. Illustrative of various processes for physical vapor deposition of a coating on a cutting tool are U.S. Pat. Nos. 4,469,489; 4,406,669; 4,539,251 and 4,337,300.

However, because ceramic substrates are inherently electrically insulating, ion-plating of a titanium nitride coating on a ceramic substrate tends to build up an electrical charge on the substrate surface. The applied bias voltage between the plasma and the ceramic substrate influences the adhesive qualities of the titanium nitride coating. Ineffective voltage biasing due to electrical charge buildup results in flaking of the coating from the ceramic substrate thereby producing a less than satisfactory coated ceramic.

To overcome the aforementioned problems, we have invented a novel process for physical vapor deposition of a refractory coating on a nonconductive substrate. More particularly, the present invention utilizes the ion-plating physical vapor deposition process for coating with titanium nitride any suitable nonconductive substrate such as a substrate made of a ceramic material and the like. Any suitable ceramic substrate such as a salon (Si—Al—ON) based ceramic substrate or $Si_3N_4$ based ceramic substrate or $Al_2O_3$ based ceramic substrate including $Ac_2O_3$ composites alloyed with or without additions of zirconia and/or other hard materials such as Silicon Carbide whiskers may be coated by the present invention. The present invention provides a process for depositing a titanium nitride coating on the nonconductive substrate by overcoming the ineffectiveness of the applied bias voltage between the plasma and the insulating substrate.

Accordingly, an object of the present invention is to provide a coating with an improved adhesion strength to a tool or article by a-physical vapor deposition process, such as ion-plating.

Another object of the present invention is to provide a coated article or tool having high wear resistance, heat resistance and corrosion resistance.

Yet another object of the present invention is to provide cutting tools, wear resisting tools, wear parts and decorative articles with an improved wear resistance, heat resistance and corrosion resistance.

SUMMARY OF THE INVENTION

Briefly, according to this invention, there is provided a process of physical vapor deposition of a refractory coating, preferably a titanium nitride coating on a nonconductive substrate such as a ceramic substrate. The process involves cleaning the nonconductive substrate surfaces and then depositing by physical vapor deposition a first layer of a refractory metal such as titanium and then depositing a second layer of a refractory metal compound such as titanium nitride to produce a coated nonconductive substrate having enhanced coating adhesion.

The first layer increases the electrical conductivity of the nonconductive substrate such that electrical biasing in the ion-plating process becomes effective. An ion-plated titanium nitride coating on a ceramic substrate, such as a ceramic insert cutting tool, has been found to reduce flank wear, reduce the coefficient of friction between the cutting tool and a workpiece such as cast iron or nickel-based superalloy in the instance of Si—Al—ON based ceramic substrates or carbon and high temperature steels in the instance of $Al_2O_3$ based ceramic substrates, resulting in reduced frictional forces, and because of the chemical stability of titanium nitride, act as a diffusion barrier between the insert cutting tool and the workpiece thereby reducing tool catering, flank wear and nothing problems.

BRIEF DESCRIPTION OF THE DRAWINGS

Further features and other objects and advantages of this invention will become clear from the following detailed description made with reference to the drawings in which.

DESCRIPTION OF THE PREFERRED EMBODIMENTS

Figure 1:
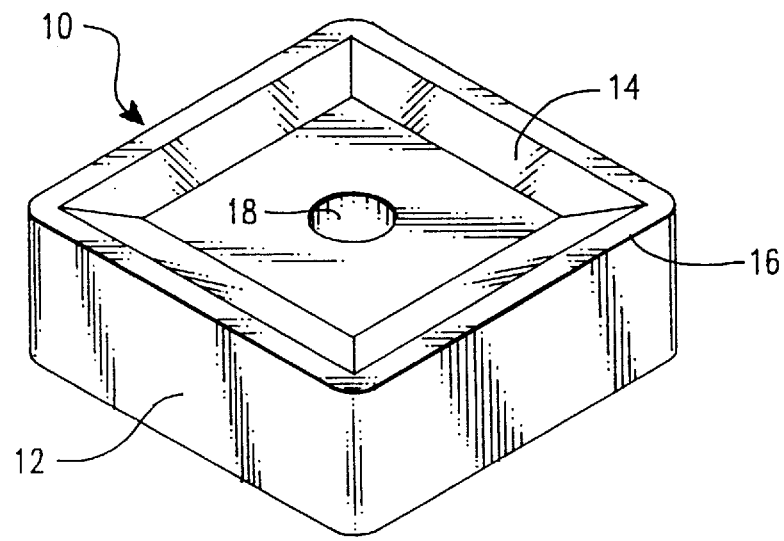
FIG. 1 is a perspective view of a Keno style insert.

Although the present invention is described in reference to an ion-plating physical vapor deposition process for coating a nonconductive ceramic substrate, the present invention may also be used to coat most any suitable nonconductive substrate. The nonconductive substrate is coated by cleaning the nonconductive substrate surface and then depositing a first layer of titanium on the cleaned substrate surface. A second layer of titanium nitride is then deposited upon the first layer to produce a coated substrate having an outer layer coating exhibiting enhanced adhesion properties.

In an ion-plating physical vapor deposition process, the nonconductive substrate acts as an electrical insulator as opposed to being electrically conductive, thereby causing an electrical charge to build up on the substrate surface. The buildup of the electrical charge effectively decreases the applied bias on the substrate, which in turn results in a poor adhesive quality of a titanium nitride coating to a nonconductive substrate.

It will be appreciated that the physical vapor deposition process of the present invention may also include evaporation, reactive evaporation, ion-plating, sputtering, and magnetos sputtering and is not limited to ion-plating. However, in a preferred embodiment, the titanium nitride layer is deposited by ion-plating wherein the material to be vapor-deposited is energized as positive ions by applying a negative accelerating voltage to the substrate. As used herein, ion-plating is the process occurring at the substrate and is effectively independent of the method used to generate the ions which combine to form the coating compound. For example, a variety of methods to produce metallic ions may be used for ion plating, such as thermal evaporative ion-plating, sputter ion-plating or arc evaporative ion-plating and the like.

The present invention is applicable in the production of a coated article such as a cutting tool insert having a nonconductive ceramic insert substrate. The cutting tool insert may be made by conventional ceramic powder processing techniques and densified by either hot pressing or pressure less sintering. The ceramic insert substrate may include Si—Al—ON based-ceramic cutting inserts, $Ac_2O_3$ based ceramic cutting inserts and other articles such as but not limited to that marketed by Kennametal Inc. under the designations KYON 2000, KYON 3000 and K090. KYON and K090 are registered trademarks of Kennametal Inc. for ceramic materials and wear resisting pieces in the form of cutting tool inserts and for wear resisting pieces consisting of hard ceramic material in the form of cutting tool inserts-namely, inserts for use in dies and tools for cutting, shaping or forming materials; respectively.

The Si—Al—ON grade cutting inserts may be either beta-prime Si—Al—ON, alpha-prime Si—Al—ON, or mixtures thereof, and may also contain a glassy phase ranging from zero to 10 percent by weight. Kyon 3000 is a beta-prime Si—Al—ON expressed by the chemical formula $Si_{6-z}Al_zO_zN_{8-z}$ wherein z has a value greater than 0 but less than 4.2. For a description of a beta-prime Si—Al—ON material reference is made to U.S. Pat. No. 4,127,416, which is incorporated herein by reference. KYON 2000 is an alpha-prime beta-prime Si—Al—ON. Alpha-prime Si—Al—ON is expressed by the chemical formula $M_x(Si, Al)_{12}(O,N)_{16}$ wherein x is larger than 0 but not more than 2 and M is at least one selected from the group consisting of Li, Na, Ca, Mg, Y, and any rare earth element. For a complete description of mixed alpha-prime beta-prime Si—Al—ON compositions useful for cutting tool inserts, reference is made to U.S. Pat. Nos. 4,563,433 and 4,547,470, which are incorporated herein by reference.

Among the various $Ac_2O_3$ based ceramic cutting inserts contemplated by the present invention are cutting inserts having an $Al_2O_3$ microstructure in which SiC and/or refractory metal (titanium, hafnium, vanadium, tantalum, zirconium, and niobium) compounds (oxides, nitrides, carbides and carbonitrides) such as preferably TiC and/ or $ZrO_2$ particles and/or SiC or TiC whiskers dispersed therein. As disclosed in Mehrotra et al. U.S. Pat. No. 4,959,332 and assigned to Kennametal Inc., the alumina based ceramic cutting inserts may be provided with about 1.5 to 12.5 v/o (volume percent) silicon carbide whiskers and about 7.5 to 17.5 v/o zirconia dispersed in an alumina based matrix. Yet another $Al_2O_3$ based ceramic cutting insert is described in Mehrotra et al. U.S. Pat. Nos. 4,959,331 and 4,965,231 assigned to Kennametal Inc., the $Al_2O_3$ based cutting inserts may contain about 1.5 to 17.5 v/o silicon carbide whiskers, about 5 to 17.5 v/o zirconia, the residue of a magnesium oxide or other magnesium-oxygen compound addition, and at least 4 v/o tetragonal zirconia. Still another $Al_2O_3$ based cutting insert is described in Mehrotra et al. U.S. Pat. No. 4,960,735 assigned to Kennametal Inc. The $Al_2O_3$ based cutting insert described in U.S. Pat. No. 4,960,735 may include 1.5 to 37.5 v/o silicon carbide whiskers, about 5 to 17.5 v/o zirconia, the residue of a magnesium oxide or other magnesium-oxygen compound addition, and at least 2 v/o tetragonal zirconia. Silicon carbide whiskers ($SiC_w$) are discontinuous, single crystal Silicon carbide (SiC) fibers and are well known in the art. The silicon carbide whiskers utilized may be of any commercially available brand which have been used in the past in the alumina based cutting inserts. It will be appreciated that a layer of TiN over a $Al_2O_3$—SiC whisker reinforced composite may provide a chemically inert barrier to prevent reaction of the SiC whiskers with a steel workpiece.

For an example of a ceramic composition including an alumina matrix having titanium carbide (TiC) whiskers dispersed therein reference is made to U.S. Pat. No. 4,852,999 assigned to Kennametal Inc.

U.S. Pat. No. 4,852,999 and U.S. Pat. Nos. 4,959,332; 4,959,331; 4,965,231 and 4,960,735 assigned to Kennametal Inc. are incorporated herein by reference.

A preferred composition of an $Al_2O_3$ based ceramic insert may contain about 5–10 v/o zirconia with or without sintering aid additions, particles and/or whiskers of refractory metal compounds and/or SiC whiskers.

The $Al_2O_3$ based ceramic inserts are prepared by grinding the insert surfaces to a fine finish. A die penetrant of a type well known in the art may then be applied to the insert to assist in the visual evaluation of the grinding finish and check for grinding cracks. The die penetrant is preferably removed by ultrasonic cleaning for approximately one hour in a soap and warm water mixture of about 56 degrees centigrade. The insert is then baked in an air fired oven of a type typically used in drying operations to thoroughly evaporate the cleaning mixture. It will be appreciated that the use of the die penetrant and the cleaning procedure used to remove the die penetrant from the insert may be omitted and has no effect on the present invention.

Applicants have found that, by initially thoroughly cleaning the substrate surface under vacuum by heating and ion etching the substrate for a sufficient length of time to present a surface free of contaminants and then depositing a first layer of titanium on the nonconductive substrate, the aforementioned problems associated with electrical conductivity are overcome.

A ceramic substrate is placed within a chamber, evacuated and then filled with an inert gas, such as argon. The inert gas is partially ionized and excited in the plasma as previously described. The ceramic substrate is then cleaned by heating and ion-etching. The ceramic substrate may be heated by any suitable means known in the art, such as electron bombardment. In electron bombardment, a positive potential is placed on the substrate within the chamber to attract electrons from the gaseous plasma. Under a vacuum of approximately $10^{-3}$ torr, the substrate is heated by the electrons striking the substrate surface thereby removing various oxides from the substrate surface. The Si—Al—ON based substrate and the $Al_2O_3$ based substrate are preferably heated to at least a temperature of approximately 400° C. It should be noted that although there is also a charge buildup during electron bombardment, the electron current density between the substrate and plasma is high enough to overcome this buildup and thus allow surface heating by electron bombardment. The substrate is then subjected to ion-etching wherein the polarity of the substrate is reversed to a negative potential to attract heavy argon ions typically used for ion-etching from the-gaseous plasma to the substrate to further remove surface contaminants such as grease, dust and the like. Applicants have found, depending upon temperature, surface area of the insert to be cleaned, and degree of contamination, a ceramic substrate may be cleaned in a vacuum after a period ranging from approximately four hours to six hours. For example, the higher the heating temperature the shorter the period of cleaning required to achieve a substrate substantially free of contaminants.

A first layer of titanium is then evaporated and deposited over the cleaned ceramic substrate. The titanium is evaporated and deposited for approximately ten minutes by any known suitable means such as resistance heating, electron bombardment, or radio-frequency inductive heating. The deposited titanium layer increases the electrical conductivity of the ceramic substrate surface at the deposition temperature such that electrical biasing during the physical vapor deposition process becomes effective.

A second layer of titanium nitride is then deposited upon the first layer. The second layer of titanium nitride is deposited by introducing nitrogen gas into the vacuum chamber to react with the titanium present to form titanium nitride. The negative bias of the titanium coated substrate causes a resultant glow discharge to increase the kinetic energy of the depositing titanium nitride material thereby resulting in the deposition of a coating of titanium nitride of variable thickness. As a result of the present invention, excellent coating adhesion and dense coating structures may be obtained for a ceramic substrate.

Figure 2:
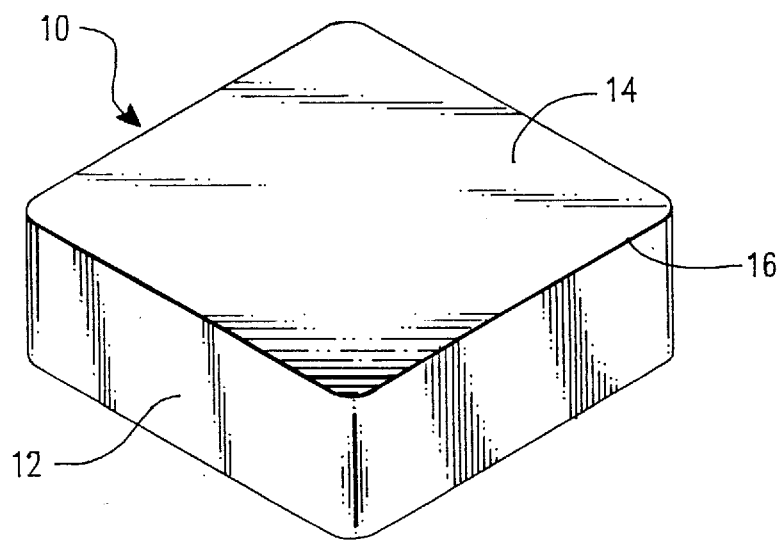
FIG. 2 is a perspective view of a Kenned style insert.

The invention will be further clarified by a consideration of the following examples. Several indexable metal cutting inserts in Kennametal Si—Al—ON grades and Kennametal $Al_2O_3$ grades of both Keno and Kenned styles as shown in FIG. 1 and FIG. 2, respectively; were coated with titanium nitride. As shown in FIGS. 1 and 2 each metal cutting insert 10 has a flank face 12, a rake face 14 and a cutting edge 16 at the juncture of the flank face and the rake face. Passing through the rake face of the Keno style insert shown in FIG. 1 is an opening 18. Keno and Kenned are registered trademarks of Kennametal Inc. for cutting tools having an indexable cutting insert and for carbide cutting tools, respectively.

The ceramic substrates were coated in a Balzers BAI 830 physical vapor deposition system having a vertically movable crucible. The ceramic substrates were heated under a vacuum of approximately $10^{-3}$ torr for a period ranging from approximately three hours to six hours. Titanium was then deposited on the cleaned ceramic substrates. Titanium nitride was then deposited on the titanium coating. Next, titanium nitride coating thickness and adhesion were evaluated on the flank faces of the inserts. The coating thickness and degree of adhesion using the present invention were similar to that found in physical vapor deposition titanium nitride coated cemented carbide substrates.

EXAMPLE 1

Several ceramic metal cutting inserts, styles SNGA-433 composed of Kyon 2000 and Kyon 3000 were individually heated in separate test runs for approximately 4 hours to a temperature of approximately 400° C. followed by ½ hour of ion etching at a pressure of approximately $10^{-3}$ torr in a Balzers BAI 830 system. An initial layer of titanium was then coated to the insert surface by applying an arc current of approximately 125 amps for a period of approximately five minutes to the titanium within the crucible as the crucible moved vertically within the vacuum chamber and then increasing and maintaining the arc current to approximately 200 amps for approximately five minutes. Nitrogen gas was then introduced into the system for about 80 minutes to form a titanium nitride coating on the insert surface.

Although the thickness of the titanium layer was too thin for optical microscopic measurement, the presence of the titanium layer was observed by a transmission electron microscope. The titanium nitride coating thickness was determined by the ball wear scar thickness test as set forth in Proc. 9th Int. Conf. on CVD, Electrochemical Society, Pennington, N.J., 1984, P. K. Mehrotra, D. T. Quinto and G. J. Wolfe, P. 757, which is incorporated herein by reference. The titanium nitride coating thickness was measured to be approximately 2–3 micrometers on the flank faces. The adhesion level of the coating was determined by the indentation test as set forth in Thin Solid Films, 154 (1987) 361–375 which is also incorporated herein by reference. The coating thickness and degree of adhesion using the present invention were similar to that found in physical vapor deposition titanium nitride coated cemented carbide substrates. The adhesion level was determined to be greater than or equal to 60 kg. on each sample tested.

EXAMPLE 2

Several ceramic metal cutting inserts, styles SNGA-433, composed of Kyon 2000 and Kyon 3000 were individually heated in separate test runs for approximately three hours to a temperature of approximately 400° C. followed by one-half hour of ion etching at a pressure of approximately $10^{-3}$ torr in a Balzers BAI 830 system. An initial layer of titanium was then coated to the insert surface by applying an arc current of approximately 125 amps for a period of approximately five minutes to the titanium within the crucible as the crucible moved vertically within the vacuum chamber. Arc current was then raised to approximately 200 Amps and immediately nitrogen gas was then introduced into the system for about 85 minutes to form a titanium nitride coating on the insert surface.

The titanium nitride coating thickness was determined by the ball wear scar thickness test as set forth in Proc. 9th Int. Conf. on CVD, Electrochemical Society, Pennington, N.J., 1984, P. K. Mehrotra, D. T. Quinto and G. J. Wolfe, P. 757, which is incorporated herein by reference. The titanium nitride coating thickness was measured to be approximately 2–3 micrometers on the flank faces. The adhesion level of the coating was determined by the indentation test as set forth in Example 1. The adhesion was inconsistent with some flaking of the coating. The adhesion level was determined to be approximately less than or equal to 30 kg due to insufficiently removed surface contaminants as a result of a shorter heating cycle as well as insufficient titanium layer coverage. It is believed that surface contaminants affected the application of the titanium layer to the substrate surface and in turn the applied electrical biasing of the ion plating process.

EXAMPLE 3

Several ceramic metal cutting inserts, styles SNGA-433, composed of Kyon 2000 and Kyon 3000 were individually heated in separate test runs for approximately four hours to a temperature of approximately 400° C. followed by one-half hour of ion etching at a pressure of approximately $10^{-3}$ torr in a Balzers BAI 830 system. An initial layer of titanium was then coated to the insert surface by applying to the titanium within the crucible as the crucible moved vertically within the vacuum chamber an arc current increasing from approximately 125 amps to 200 amps over a period of approximately two minutes and then maintained at 200 amps for approximately eight minutes. Nitrogen gas was then introduced into the system for about 80 minutes to form a titanium nitride coating on the insert surface.

The titanium nitride coating thickness was determined by the ball wear scar thickness test as set forth in Proc. 9th Int. Conf. on CVD, Electrochemical Society, Pennington, N.J., 1984, P. K. Mehrotra, D. T. Quinto and G. J. Wolfe, P. 757, which is incorporated herein by reference. The adhesion level of the coating was determined by the indentation test as set forth in Example 1. The adhesion level was determined to be greater than or equal to 60 kg.

It will be appreciated that the improved adhesive coating including a first layer of titanium and second layer of titanium nitride adherently deposited to a ceramic substrate such as a cutting insert has been found to reduce flank wear, and reduce the coefficient of friction between the cutting insert and a ferrous workpiece material. Moreover, because titanium nitride is chemically stable, titanium nitride has been found to act as a diffusion barrier between the cutting insert and ferrous and nickel-based workpiece materials thereby reducing tool wear problems as previously described.

EXAMPLE 4

Several ceramic metal cutting inserts, styles TNG 332T composed of approximately 73 v/o $Al_2O_3$ and 27 v/o TiC and known under the designation K090 as obtained from Kennametal Inc. were individually heated in separate test runs for approximately four hours to a temperature of approximately 400° C. followed by one-half hour of ion etching at a pressure of approximately $10^{-3}$ torr in a Balzers BAI 830 system. An initial layer of titanium was then coated to the insert surface by applying an arc current of approximately 125 amps over a period of approximately five minutes to the titanium within the crucible as the crucible moved vertically upward within the vacuum chamber and then applying an arc current of approximately 200 amps for approximately five minutes as the crucible moved vertically downward within the vacuum chamber. Nitrogen gas was then introduced into the system for about 80 minutes to form a titanium nitride coating on the insert surface.

Although the thickness of the titanium layer was too thin for optical microscopic measurement, the presence of the titanium layer was observed by a transmission electron microscope. The titanium nitride coating thickness was determined by the ball wear scar thickness test as set forth in Proc. 9th Int. Conf. on CVD, Electrochemical Society, Pennington, N.J., 1984, P. K. Mehrotra, D. T. Quinto and G. J. Wolfe, P. 757, which is incorporated herein by reference. The titanium nitride coating thickness was measured to be approximately 3 micrometers on the flank faces. The adhesion level of the coating was determined by the indentation test as set forth in Thin Solid Films, 154 (1987) 361–375 which is also incorporated herein by reference. The coating thickness and degree of adhesion using the present invention were similar to that found in physical vapor deposition titanium nitride coated cemented carbide substrates. The adhesion level was determined to be greater than or equal to 45 kg. on each sample tested.

EXAMPLE 5

Several ceramic metal cutting inserts, styles SNGA-433, having approximately 2.5 v/o $SiC_w$, 10 v/o zirconia, 0.5 v/o magnesia and the remainder $Al_2O_3$ as produced in accordance with U.S. Pat. No. 4,959,331; were ground to a fine surface finish, visually evaluated by the use of a die penetrant, and the ultrasonically cleaned as previously described. The inserts were then individually heated in separate test runs for approximately four hours to a temperature of approximately 400° C. followed by one-half hour of ion etching at a pressure of approximately $10^{-3}$ torr in a Balzers BAI 830 system. An initial layer of titanium was then coated to the insert surface by applying an arc current of approximately 125 amps over a period of approximately five minutes to the titanium within the crucible as the crucible moved vertically upward within the vacuum chamber and then applying an arc current of approximately 200 Amps for approximately five minutes as the crucible moved vertically downward within the vacuum chamber. Nitrogen gas was then introduced into the system for about 80 minutes to form a titanium nitride coating on the insert surface.

The titanium nitride coating thickness was determined by the ball wear scar thickness test as set forth in Proc. 9th Int. Conf. on CVD, Electrochemical Society, Pennington, N.J., 1984, P. K. Mehrotra, D. T. Quinto and G. J. Wolfe, P. 757, which is incorporated herein by reference. The titanium nitride coating thickness was measured to be approximately 2.6 micrometers on the flank faces. The adhesion level of the coating was determined by the indentation test as set forth in Example 1. The adhesion level was determined to be greater than or equal to 45 kg. on each sample tested.

EXAMPLE 6

Several ceramic metal cutting inserts, styles SNGA-433, having approximately 5.0 v/o $SiC_w$, 10 v/o zirconia, 0.5 v/o magnesia and the remainder $Al_2O_3$ as produced in accordance with U.S. Pat. No. 4,959,331; were ground to a fine surface finish, visually evaluated by the use of a die penetrant, and the ultrasonically cleaned as previously described. The inserts were then individually heated in separate test runs for approximately four hours to a temperature of approximately 400° C. followed by one-half hour of ion etching at a pressure of approximately $10^{-3}$ torr in a Balzers BAI 830 system. An initial layer of titanium was then coated to the insert surface by applying an arc current of approximately 125 amps over a period of approximately five minutes to the titanium within the crucible as the crucible moved vertically upward within the vacuum chamber and then applying an arc current of approximately 200 Amps for approximately five minutes as the crucible moved moved vertically downward within the vacuum chamber. Nitrogen gas was then introduced into the system for about 90 minutes to form a titanium nitride coating on the insert surface.

The titanium nitride coating thickness was determined by the ball wear scar thickness test as set forth in Proc. 9th Int. Conf. on CVD, Electrochemical Society, Pennington, N.J., 1984, P. K. Mehrotra, D. T. Quinto and G. J. Wolfe, P. 757, which is incorporated herein by reference. The titanium nitride coating thickness was measured to be approximately 2.6 micrometers on the flank faces. The adhesion level of the coating was determined by the indentation test as set forth in Example 1. The adhesion level was determined to be greater than or equal to 45 kg. on each sample tested.

EXAMPLE 7

Several ceramic metal cutting inserts, styles SNGA-433, having approximately 1.5 v/o $SiC_w$, 10 v/o zirconia, 0.5 v/o magnesia and the remainder $Al_2O_3$ as produced in accordance with U.S. Pat. No. 4,959,331; were ground to a fine surface finish, visually evaluated by the use of a die penetrant, and then ultrasonically cleaned as previously described. The inserts were then individually heated in separate test runs for approximately four hours to a temperature of approximately 400° C. followed by one-half hour of ion etching at a pressure of approximately $10^{-3}$ torr in a Balzers BAI 830 system. An initial layer of titanium was then coated to the insert surface by applying an arc current of approximately 125 amps over a-period of approximately five minutes to the titanium within the crucible as the crucible moved vertically upward within the vacuum chamber and then applying an arc current of approximately 200 Amps for approximately five minutes as the crucible moved moved vertically downward within the vacuum chamber. Nitrogen gas was then introduced into the system for about 90 minutes to form a titanium nitride coating on the insert surface.

The titanium nitride coating thickness was determined by the ball wear scar thickness test as set forth in Proc. 9th Int. Conf. on CVD, Electrochemical Society, Pennington, N.J., 1984, P. K. Mehrotra, D. T. Quinto and G. J. Wolfe, P. 757, which is incorporated herein by reference. The titanium nitride coating thickness was measured to be approximately 2.6 micrometers on the flank faces. The adhesion level of the coating was determined by the indentation test as set forth in Example 1. The adhesion level was determined to be greater than or equal to 45 kg. on each sample tested.

It will be appreciated that the improved adhesive coating including a first layer of titanium and second layer of titanium nitride adherently deposited to a ceramic substrate such as a cutting insert has been found to reduce flank wear, and reduce the coefficient of friction between the cutting insert and a ferrous workpiece material. Moreover, because titanium nitride is chemically stable, titanium nitride has been found to act as a diffusion barrier between the cutting insert and ferrous and nickel-based workpiece materials thereby reducing tool wear problems as previously described.

The patents and patent applications referred to herein are hereby incorporated by reference.

Having described presently preferred embodiments of the invention, it is to be understood that it may be otherwise embodied within the scope of the appended claims.

What is claimed is:

1. A process for the production of a coated nonconductive ceramic cutting tool substrate by physical vapor deposition in which said nonconductive ceramic cutting tool substrate is positioned within a vacuum chamber having a titanium source and filled with an inert gas partially ionized and excited to a gaseous plasma, said nonconductive ceramic cutting tool substrate having a rake face, a flank face and a cutting edge at the juncture of the rake face, the flank face, said process comprising:

(a) cleaning said nonconductive ceramic cutting tool substrate rake face, flank face and cutting edge for at least three hours under a vacuum of approximately $10^{-3}$ torr by heating said substrate to a temperature of at least 400° C. and ion etching said rake face, said flank face and said cutting edge;

wherein said heating is by high current density electron bombardment, wherein a positive potential is placed on said nonconductive ceramic substrate to attract electrons from said gaseous plasma to said rake face, said flank face and said cutting edge;

(b) depositing a first layer of titanium on said nonconductive ceramic cutting tool substrate rake face, flank face and cutting edge; and (c) depositing a second layer of titanium nitride upon said first layer to produce a coating having enhanced adhesion on said nonconductive ceramic substrate.

2. The process for the production of a coated nonconductive ceramic cutting tool substrate as set forth in claim 1 wherein said nonconductive ceramic substrate rake face, flank face and cutting edge are cleaned under said vacuum for at least four hours.

3. The process for the production of a coated nonconductive ceramic cutting tool substrate as set forth in claim 1 wherein said first layer of titanium is deposited for approximately ten minutes to increase the electrical conductivity at said nonconductive ceramic substrate rake face, flank face and cutting edge.

4. The process for the production of a coated nonconductive ceramic cutting tool substrate as set forth in claim 1 wherein said titanium nitride is at least 2 microms thick.

5. The process for the production of a coated nonconductive ceramic cutting tool substrate as set forth in claim 1 wherein said physical vapor deposition process is ion-plating.

6. The process for the production of a coated nonconductive ceramic cutting tool substrate as set forth in claim 1 wherein in said ion-etching step a negative potential is placed on said nonconductive ceramic substrate to attract ions from said gaseous plasma to said nonconductive ceramic substrate rake face, flank face and cutting edae.

* * * * *